United States Patent [19]

Gehrke

[11] Patent Number: 4,675,614
[45] Date of Patent: Jun. 23, 1987

[54] PHASE DIFFERENCE MEASUREMENT SYSTEM

[75] Inventor: Thomas E. Gehrke, Cedar Rapids, Iowa

[73] Assignee: Rockwell International Corporation, El Segundo, Calif.

[21] Appl. No.: 435,517

[22] Filed: Oct. 20, 1982

[51] Int. Cl.⁴ .......................... H03D 13/00; H03K 9/06
[52] U.S. Cl. ..................................... 328/133; 328/134; 328/155; 307/512; 342/401
[58] Field of Search ................ 328/133, 134, 155, 24, 328/166, 158, 109; 307/511, 512, 514, 516,.262; 324/83 D, 83 Q, 82, 83 R; 343/400, 401, 404, 399, 5 AF, 12 R, 5 NQ, 10, 17.5; 331/22, 25, 27; 375/81, 120; 329/124, 50

[56] References Cited

U.S. PATENT DOCUMENTS

| | | | |
|---|---|---|---|
| Re. 30,288 | 5/1980 | Hackett | 343/5 NQ |
| 3,500,217 | 3/1970 | Allen | 307/512 |
| 3,523,295 | 8/1970 | Perkins | 343/401 |
| 3,568,067 | 3/1971 | Williford | 328/134 |
| 3,569,853 | 3/1971 | Welejsza | 307/512 |
| 3,621,405 | 11/1971 | Carlsen | 328/155 |
| 3,624,526 | 11/1971 | Silverman | 328/133 |
| 3,740,655 | 6/1973 | Dickey, Jr. | 328/133 |
| 3,792,364 | 2/1974 | Ananias | 328/134 |
| 4,054,838 | 10/1977 | Tretter | 375/120 |
| 4,090,145 | 5/1978 | Webb | 328/109 |
| 4,246,653 | 1/1981 | Malm | 328/133 |
| 4,447,814 | 5/1984 | Treise | 343/401 |
| 4,470,147 | 9/1984 | Goatcher | 328/109 |
| 4,475,088 | 10/1984 | Beard | 328/134 |

Primary Examiner—Stanley D. Miller
Assistant Examiner—Timothy P. Callahan
Attorney, Agent, or Firm—George A. Montanye; Robert C. Mayes; H. Fred Hamann

[57] ABSTRACT

A system and technique is disclosed which enables the production of in-phase and quadrature phase signals useful for deriving phase difference measurements. In an in-phase and quadrature phase difference measurement system, the phase shifter employed must receive an input signal and produce an output signal which is 90° out of phase and equal in amplitude to the input signal over the full frequency range of the input signal. This is accomplished by using a phase locked loop which locks onto the input signal and uses the output of a voltage controlled oscillator located in the loop to derive the sine and cosine of the input signal. The resulting sine and cosine outputs are then 90° out of phase and form in-phase and quadrature phase signals which have equal amplitudes. These two signals maintain lock over the frequency range of the input signal and may be used as inputs in the phase difference measurement system.

1 Claim, 5 Drawing Figures

PHASE DIFFERENCE MEASUREMENT SYSTEM

BACKGROUND OF THE INVENTION

The present invention relates to signal measurement systems and more particularly to phase difference measurement systems using in-phase and quadrature phase signals.

In the prior art, there are a variety of systems which employ phase difference measurement techniques to determine certain characteristics of the system. In such systems, a variable input signal is generally provided which reflects changing system characteristics by producing a change in the phase of that input signal. A reference signal, which maintains a constant phase, is then compared with the variable phase signal in a comparator circuit to produce a phase difference which is directly proportional to the changing characteristic of the system. By measuring the phase difference of the variable input signal with respect to the reference signal, the magnitude, rate of change or other calculation may be determined with respect to the selected characteristic.

By way of example, in one type of aviation navigation system known as the very high frequency omnidirectional range (VOR) technique, a phase difference measurement is made to provide an indication of aircraft bearing with respect to ground positions for enabling aircraft navigation. This particular system is conventional and is currently utilized for aircraft navigation throughout the world. As is known, the system includes a plurality of ground stations positioned at various points throughout each country with each of the stations precisely located on aircraft navigation maps. By determining the location of an aircraft with respect to any one or more of the ground stations, the exact location and course of that aircraft can be accurately fixed.

In one type of VOR system, the VOR ground station includes an omnidirectional transmitter which operates in the carrier frequency range of 108 to 118 MHz and transmits two 30 Hz modulating signals. One of the 30 Hz signals is an FM omnidirectional reference signal which is constant regardless of the radial position of an aircraft with respect to the VOR ground station. The other 30 Hz signal is a variable AM signal which has its phase shifted with respect to the reference signal by an amount dependent upon the angular location of an aircraft with respect to the VOR ground station. The system is designed to allow a measurement of the radial position of an aircraft from the ground station with respect to magnetic north by determining the phase difference between the variable 30 Hz AM signal and the 30 Hz FM reference signal. This phase difference can be converted directly into a bearing indication or used to control a VOR indicator or other display device capable of providing indications of aircraft bearing.

Originally, phase differences in any phase difference measurement system were detected using analog devices and displayed by mechanical or electromechanical instruments. With the advent of digital circuits and computer technology, however, many of the old mechanical and electromechanical systems are being replaced with solid state circuitry. While the advances in technology have provided improved accuracy, reduced weight, lower power consumption, and a reduction in the physical size of the system, other difficulties in converting to digital formats have been encountered that were not observed in prior analog systems. In addition, as many aircraft systems are converted to digital implementations, there is a trend to employ microprocessor-based instrumentation which provides highly efficient and accurate digital calculations but which is limited in size and speed over larger systems. There is therefore a continuing need to improve the operating speed and accuracy of such microprocessor-based instrumentation systems without requiring significant increases in the digital circuitry.

Accordingly, the present invention has been developed to overcome the shortcomings of the above known and similar techniques and to provide an improved digital system for providing phase difference calculations, particularly in connection with VOR bearing measurements.

SUMMARY OF THE INVENTION

In accordance with the present invention, a 30 Hz reference signal and a 30 Hz variable signal are available from a VOR ground station. Each of these signals is filtered and digitized for subsequent digital processing. In one embodiment, the 30 Hz reference signal is transmitted as an input signal through a digital multiplier, digital amplifier, digital loop filter, and thence through a digital voltage controlled oscillator to produce a ramp output which generates a digital cosine waveform for multiplication in the digital multiplier with the input signal. This structure produces a digital phase locked loop which maintains a 90° phase shift between the input signal and the loop signal into the multiplier. The ramp output of the voltage controlled oscillator is used to address a sine/cosine look-up table which provides two sine wave output signals (in-phase and quadrature phase) equal in amplitude and phase shifted by 90°. Each of these output signals are directed to a digital multiplier where they are multiplied by the variable 30 Hz signal to produce in-phase and quadrature phase components which may be filtered and combined by taking the inverse tangent to produce a signal output representing a detected phase difference. Since the phase locked loop is locked to the 30 Hz reference signal regardless of its frequency and since the in-phase and quadrature phase signals are taken from the same table, the required 90° phase shift between the in-phase and quadrature phase signals is always maintained along with the same amplitude for both signals. The resulting digital signal output responds quickly to phase difference changes and has a low phase difference measurement error.

It is therefore a feature of the invention to provide a phase shift measurement technique which employs a phase locked loop.

It is a further feature of the invention to provide a phase difference measurement technique which includes the generation of equal amplitude in-phase and quadrature phase signals locked to the frequency of an input signal.

Still another feature of the invention is to provide a digital phase locked loop which produces equal amplitude in-phase and quadrature phase signals locked to the frequency of an input signal.

Yet another feature of the invention is to provide a digital VOR bearing determining system and technique which includes a digital phase locked loop producing equal amplitude in-phase and quadrature phase signals locked to a reference signal over the frequency range of said reference signal.

Another feature of the invention is to provide a VOR bearing circuit and technique which produces equal amplitude in-phase and quadrature phase signals and combines the signals with the variable 30 Hz VOR signal for producing a phase measurement representing aircraft bearing.

A still further feature of the invention is to provide a digital VOR bearing system and technique which multiplies a 30 Hz variable VOR signal with equal amplitude in-phase and quadrature phase signals to produce sine and cosine components the arc tangent of which is representative of the bearing.

Yet a still further feature of the invention is to provide a digital VOR bearing circuit which may be controlled and implemented with microprocessor techniques and at reduced sampling rates.

These and other advantages and novel features of the invention will become apparent from the following detailed description when considered with the accompanying drawings wherein:

DETAILED DESCRIPTION OF A PREFERRED EMBODIMENT

Figure 1:
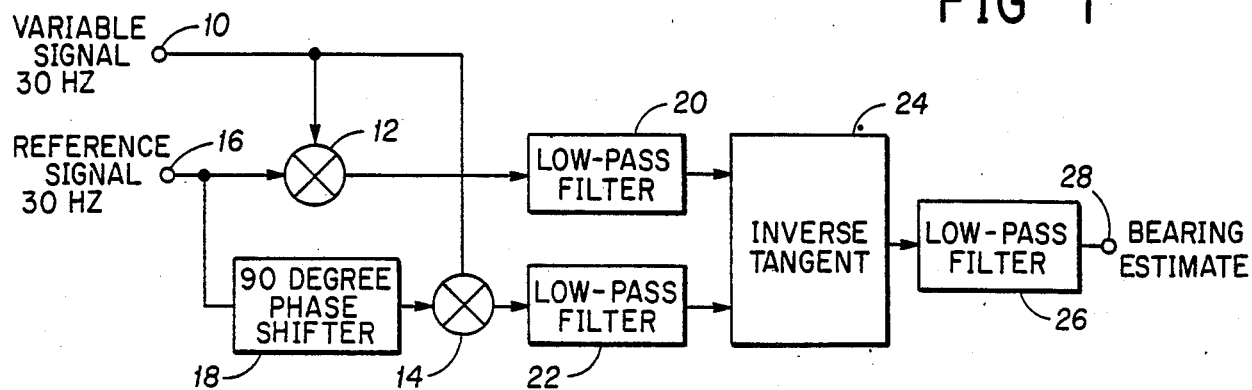
FIG. 1 is a block diagram showing the primary elements of a phase difference measurement technique as applied to a VOR bearing system.

Referring now to the drawings wherein like numerals refer to like elements throughout, there is disclosed a phase difference measurement system in accordance with the present invention. For purposes of illustration, the present technique and system will be described with reference to its specific implementation for producing a digital indication of VOR bearing useful in aircraft navigation systems. It should be understood, however, that the specific structural combinations and techniques described with respect to the inventive concept may be employed in a variety of other phase difference measurement systems and not specifically restricted to VOR signals.

Turning first to FIG. 1, there is shown a proposed implementation of the phase difference measurement system in accordance with the present invention. In this example, a variable signal, in this instance one of the 30 Hz signals from the VOR, is provided as input to terminal 10 and coupled as one input to multipliers 12 and 14. As previously noted, one of the 30 Hz signals varies in phase depending upon the position of an aircraft relative to the particular ground station transmitting the VOR signal. A second input, in this instance the other 30 Hz reference signal from the same VOR, is coupled to terminal 16. The in-phase portion of the reference signal is coupled as a second input to multiplier 12 and also through a 90° phase shifter 18 to produce a quadrature phase portion as the second input to multiplier 14. The 30 Hz reference signal from the VOR at terminal 16 and the output formed from 90° phase shifter 18 produce the sine and cosine components of the relatively quiet 30 Hz reference signal. Each of these signals is then multiplied in multipliers 12 and 14 by the 30 Hz variable phase signal from the same VOR station. The outputs from multipliers 12 and 14 are low pass filtered and are thus proportional to the sine and cosine of the bearing. As is known, the arc tangent of the ratio of the sine and cosine can then be computed with the resultant output filtered to represent an aircraft bearing estimate. Accordingly, the outputs from 12 and 14 are coupled through their respective low pass filters 20 and 22 to an inverse tangent circuit 24 having its output coupled through a low pass filter 26 to produce the bearing estimate at terminal 28.

In order to understand the operation of the above system, the following mathematical derivations can be shown to support the production of the bearing estimate signal at output terminal 28. Specifically, assume that the input signals to terminals 10 and 16, respectively, are, at terminal 10

$$v(t) = \sin(\omega t + \phi) \quad (1)$$

and at terminal 16

$$r(t) = \sin(\omega t) \quad (2)$$

where v is the variable 30 Hz signal at terminal 10, r is the reference 30 Hz signal at terminal 16, $\omega$ is nominally $2\pi$ 30 radians per second, $\phi$ is the phase shift caused by the bearing, and t is the time. In accordance with FIG. 1, the reference signal includes a signal $$s(t) = \sin(\omega t) \quad (3)$$

and a signal from 18 phase shifted by 90°

$$c(t) = \cos(\omega t) \quad (4)$$

Now, as shown in FIG. 1, v(t) is multiplied in multipliers 12 and 14 by c(t) and s(t), respectively, to give $$\begin{aligned} f(t) &= v(t)\,s(t) \\ &= \sin[(\omega t) + \phi]\sin(\omega t) \\ &= 0.5[\cos(\phi) - \cos(2\omega t + \phi)] \end{aligned} \quad (5)$$

and $$\begin{aligned} g(t) &= v(t)\,c(t) \\ &= \sin[(\omega t) + \phi]\cos(\omega t) \\ &= 0.5[\sin(\phi) + \sin(2\omega t + \phi)] \end{aligned} \quad (6)$$

Looking at equations 5 and 6 above, as output from multipliers 12 and 14, respectively, the same can be low pass filtered through filters 20 and 22 to remove the double frequency components of the two signals, thereby resulting in the signals $$f(t) = 0.5\cos(\phi) \quad (7)$$

and $$g(t) = 0.5\sin(\phi) \quad (8)$$

As can be seen, these two signals, as provided at the output of filters 20 and 22, are the sine and cosine of the bearing as reflected by the phase of the variable signal at terminal 10. The arc tangent of their ratio through inverse tangent circuit 24 may then be used to compute a bearing estimate which may be low pass filtered through 26 to provide the final bearing output at 28.

In order to digitally implement the production of a bearing signal from the analog VOR signals, it will be apparent that the 30 Hz variable signal and 30 Hz reference signal must first be digitized by analog-to-digital converters (not shown) and then appropriately filtered to produce the proper digital representations of the analog signals. The digital techniques and structures utilized in making such conversions and filtering are well known in the art and will therefore not be disclosed in any greater detail than is necessary for a proper understanding of the invention. It should be understood, likewise, that the multipliers 12 and 14, low pass filters 20 and 22, inverse tangent circuit 24 and low pass filter 26 are also conventionally constructed digital circuits capable of performing the functions indicated in a conventional manner.

Although the above circuit and mathematical theory verifies that sine and cosine values of a bearing may be theoretically obtained at the outputs of filters 20 and 22, in practice the implementation of the technique requires that the sine and cosine values of the reference signal, provided as input to the multipliers 12 and 14, be equal in amplitude and phase shifted by exactly 90°. As will be understood, in the operation of any VOR system, the 30 Hz signals, while being approximately constant over time and temperature, are sometimes subject to fluctations in frequency and amplitude. In order for the implementation of FIG. 1 to be successful, signals provided as the inputs to multipliers 12 and 14 must follow such changes in frequency and must also be of equal amplitude regardless of the variations in the amplitude at terminal 16. As a practical matter, this requires phase shifter 18 to be responsive to cnanges in the frequency and amplitude at terminal 16 to provide a constant 90° phase shift in spite of frequency deviations at terminal 16.

Most conventional digital phase shifters are incapable of accomplishing the above-noted function. Accordingly, if a phase shifter 18 were constructed to respond to a fixed amplitude reference signal at 30 Hz, any change in that frequency or amplitude might well result in deviations causing unequal sine and cosine signals and phase shifts of other than 90°. When this occurs, the multiplications in 12 and 14 produce distorted bearing components and their subsequent arc tangent ratio is inaccurate in providing the output bearing estimate.

In order to implement such a phase shifter using conventional techniques as that provided by a finite impulse response Hilbert transformer, significant modifications must be made and high density computation circuits must be available to produce acceptable results. In commercial aircraft systems, using low cost microprocessors, the sampling and computation rate must be low enough to permit all of the calculations necessary for filtering, phase shifting and inverse tangent computations without exceeding the microprocessor capacity. Accordingly, unless large capacity and high speed digital processors are employed, the above proposed implementation cannot be practiced.

In an effort to overcome the above restrictions and in accordance with the present invention, the required 90° phase shift needed to produce the in-phase and quadrature phase signals, can be produced by use of a phase locked loop which tracks the 30 Hz reference signal and which is constructed to produce sine and cosine values of equal amplitude and separated by 90°. In this instance, the sine and cosine may be generated from a single look-up table wherein the cosine is obtained by offsetting in the look-up table by 90° or the sine and cosine may be generated by mathematical techniques (cordic algorithm or series expansion) in response to the phase locked loop. When this occurs, the sine and cosine components of the reference signal are inherently equal in amplitude and are exactly 90° phase shifted with respect to one another. Also, since the phase locked loop tracks the 30 Hz reference signal, any changes in frequency are tracked, making the phase locked loop amplitude and frequency independent.

Figure 2:
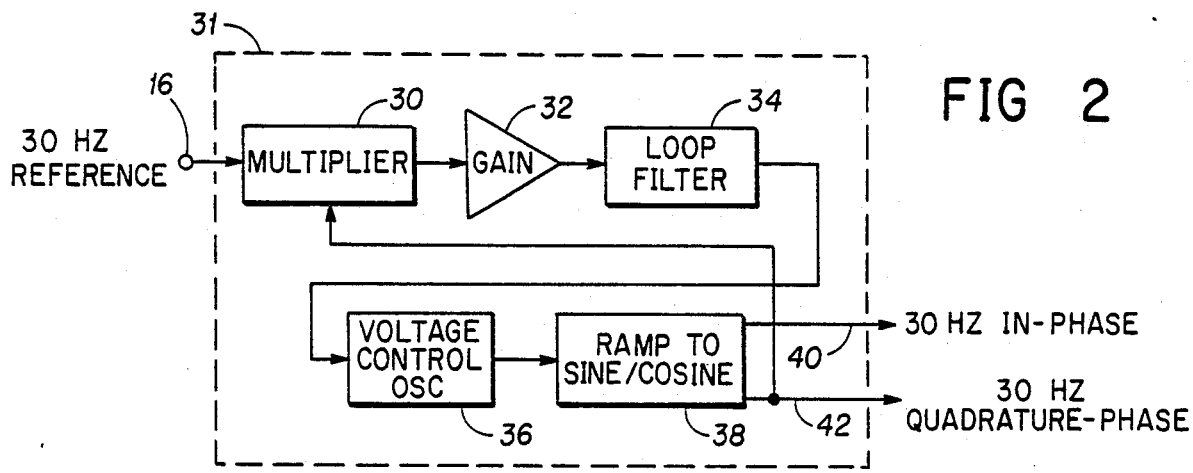
FIG. 2 is a block diagram showing the primary elements of a digital phase locked loop for producing equal amplitude in-phase and quadrature phase signals for use in connection with the system of FIG. 1.

Implementation of the above phase locked loop may now be understood with reference to FIG. 2. The phase locked loop includes a multiplier 30 which receives the digitized and filtered 30 Hz reference signal as one input and provides an output to a digital amplifier 32 having its output coupled to a digital loop filter 34 and thence to a voltage controlled oscillator 36. The voltage controlled oscillator 36 in turn has its output coupled to a ramp to sine/cosine generator 38 which responds to the ramp output from the voltage controlled oscilator 36 to address a matrix of sine values and produce an output 40 which is the in-phase component (sin) of the 30 Hz reference signal and an output 42 which is the sine value offset by 90° in the matrix, representing the quadrature phase component (cos) of the 30 Hz reference signal. Since both the in-phase and quadrature phase signals of 40 and 42 are generated by the same technique, they will always be 90° apart and of equal amplitude. The quadrature phase output at 42 is then coupled back to complete the phase locked loop as a second input to the multiplier 30 which locks the loop to the 30 Hz reference signal. Accordingly, as the reference signal varies from the 30 Hz frequency in a typical VOR system, the difference output from the multiplier 30 as reflected at the output of loop filter 34 will cause the voltage controlled oscillator 36 to produce an output from sine/cosine generator 38 which follows the frequency variation. The loop is thus responsive to those changes and variations without sacrificing the required need for equal amplitude in-phase and quadrature phase signals at the outputs from 40 and 42.

In implementing the phase locked loop of FIG. 2, conventional digital circuits may be employed or appropriate and well-known microprocessor computation techniques may be used to provide digital computations. Thus, the individual elements 30, 32, 34, 36 and 38 may be implemented by discrete digital circuits performing those functions or by the performance of microprocessor computations on the digital values received at the terminals 16. Such digital elements and microprocessor control are known and are unnecessary for a further understanding of the invention. However, in connection with the generation of the in-phase and quadrature phase signals at the outputs 40 and 42, it should be noted that they are derived by addressing a look-up table or using an alternative sine/cosine generating technique in response to the output from voltage controlled oscillator 36.

Typically, in a digital phase locked loop, the output from loop filter 34 will be a value representing a digital increment which controls the count produced by circuits in the voltage controlled oscillator 36 and thereby varies the period during which a predetermined ramp count is provided at the output of 36. In normal operation, the increment will be a preset magnitude (that needed to produce phase lock of a specific frequency) and the voltage controlled oscillator will produce a ramp output which counts a predetermined number during the 30 Hz reference period. As long as the signal generated by the ramp output from voltage controlled oscillator 36 when multiplied with the digitized 30 Hz reference signal produces a zero output at multiplier 30, the loop will be locked. As the 30 Hz reference changes, the output from the multiplier 30 will also change to produce a signal indicative of a given magnitude of increase or decrease to be made in the preset increment to the count output of voltage controlled oscillator 36. Thus, if the frequency of the 30 Hz reference increases, the output of the multiplier 30 produces a signal representing a given magnitude of increment (greater than preset increment) proportional to the change in frequency so that that increment is added in the counter of voltage controlled oscillator 36 to produce a ramp function which reaches its count more quickly (shorter period) to track the change in reference frequency. Likewise, when the reference frequency decreases, the output of multiplier 30 produces a signal representing a predetermined magnitude increment (less than preset increment) proportional to the change in frequency so that that increment when added during the count of voltage controlled oscillator 36 increase the period of the ramp output and tracks through the multiplier 30.

The above is a description of the normal operation of a digitally incremented phase locked loop. In one specific example of the present invention, the digital ramp output of the voltage controlled oscillator 36 may represent discrete addresses corresponding to different phase angles. Each discrete address may be correlated with a specific sine value in a digital matrix representing a sine/cosine look-up table. Thus, the sine/cosine look-up table may be a programed-read-only-memory (PROM) which provides a sine and cosine output in response to the address provided by the output of the voltage controlled oscillator 36. In the given example, the look-up table would be tied to specific counts from the output of the voltage controlled oscillator so that at any given count, that count would represent an address in the PROM which would in turn represent a sine value to be provided as the in-phase output on line 40. At the same time, the PROM would simultaneously output a sine value offset 90° with respect to the in-phase address, thereby providing the quadrature phase output on line 42 and the second input to the multiplier 30. In this manner, the loop would maintain track and still provide the equal amplitude in-phase and quadrature phase components phase shifted by exactly 90° regardless of the variation in reference frequency or amplitude at terminal 16. Naturally, the output from the voltage controlled oscillator could also be used to produce calculations of sine and cosine values using the previously mentioned or other alternative techniques in lieu of the look-up table.

Figure 3:
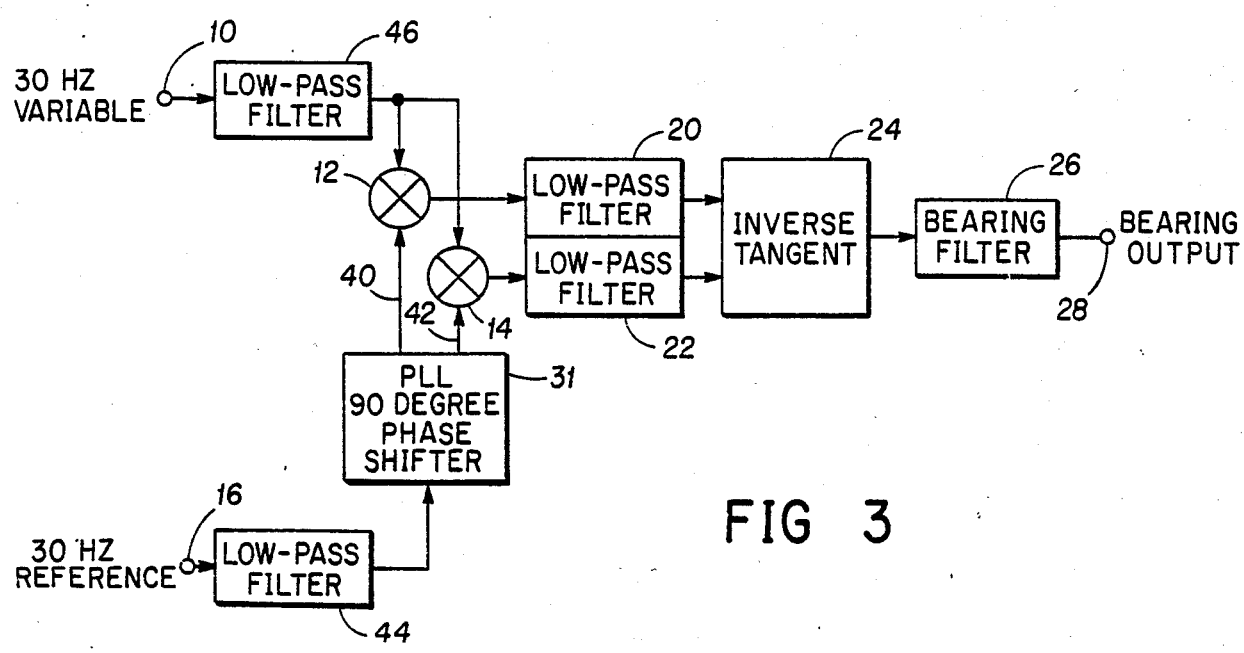
FIG. 3 is a block diagram incorporating the phased lock loop of FIG. 2.

Referring now to FIG. 3, there is shown the described system of FIG. 1 incorporating the phase locked loop, phase shifter 31 of FIG. 2. In this instance, low pass filters 44 and 46 are also inserted in series with the terminals 10 and 16 to provide the appropriate digital low pass filtering after the 30 Hz analog signals have been digitized. In all other respects, the embodiment of FIG. 3 operates in accordance with that described with respect to FIG. 1 by virtue of the tracking provided by phase locked loop 31. Accordingly, as the frequency of the 30 Hz signals vary in accordance with time or temperature changes in the VOR ground station, the phase locked loop 31 will track and provide the appropriate sine and cosine values to produce the equal amplitude in-phase and quadrature phase signals separated by exactly 90° for multiplicaton with the variable signal in multipliers 12 and 14. The outputs from multipliers 12 and 14, as provided through low pass filters 20 and 22, will thus track the sine and cosine of the phase shift representing the bearing signal. After performing the arc tangent computation of the ratio, the bearing output at 28 may then be provided after filtering through circuit 26.

The operation of the above system and technique was simulated using a PDP 11/60 computer programmed in Fortran to produce the functions of the above described system, but using simulated digitally generated VOR bearing signals. The program used to produce the simulation is set forth below. The same program and a microprocessor could be used to produce the digital phase difference measurement system of FIG. 3 merely by digitizing and feeding actual VOR signals at 10 and 16 in place of the digitally generated VOR signals specified in the program.

In the simulation of the above embodiment, the digitized variable signal and the reference signal at terminals 10 and 16 were provided at a rate of 281.532 Hz. In addition, the loop filter was constructed in accordance with the following criteria as reflected in the appended program:

$$Xi = GAIN \cdot Xi$$

$$Y1i = Y1(i-1) + (1 + AFAC \cdot DT/2) \cdot Xi + (AFAC \cdot DT/2 - 1) \cdot Y2(i-1)$$

$$Y2i = Xi$$

$$Y3i = Y3(i-1) + KIN \cdot [Y1i - Y3(i-1)]$$

where Xi is the input signal to loop filter 34, Y1i, Y2i and Y3i, are stored variables, Y1(i−1) and Y3(i−1) are stored values from the previous time period, Y3i is the output from loop filter 34, the GAIN from element 32 is 0.08614, AFAC=1.2942, KIN=0.033477 and DT=0.003552. Naturally, i is an index where i represents the present time sample and i−1 represents the time sample during the period immediately preceeding the present time sample. This configuration results in a loop lock with a fixed phase shift of 90° minus one sample delay relative to the incoming signal at terminal 16. Accordingly, for a 90° fixed phase shift, the reference channel signal is delayed by one sample before it enters the phase locked loop. This may be accomplished with any typical digital delay circuit. Addition of the low pass filters 44 and 46, which may be conventional two-pole low pass filters, allows the sample frequency to be reduced to the 281.532 Hz from a normal 1126.532 Hz rate.

Figure 4:
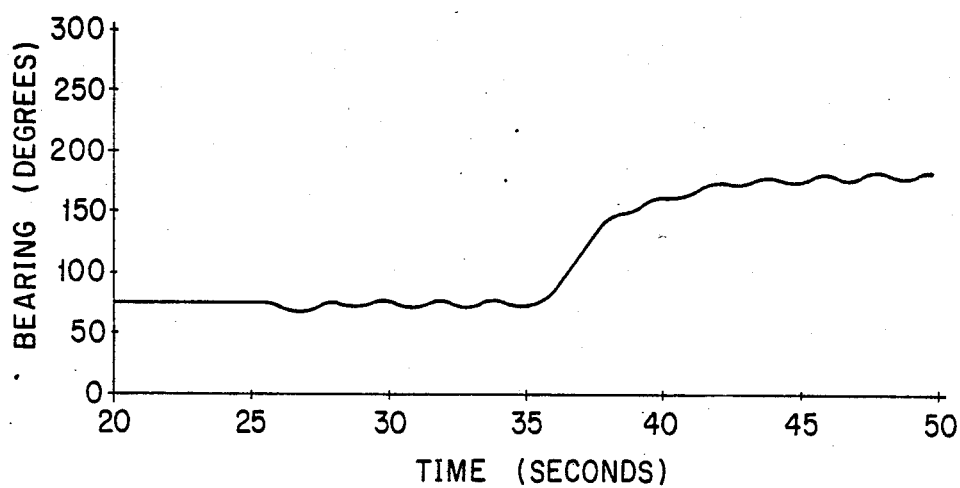
FIG. 4 is a graph showing a simulated bearing response time using the circuit of FIG. 1.
Figure 5:
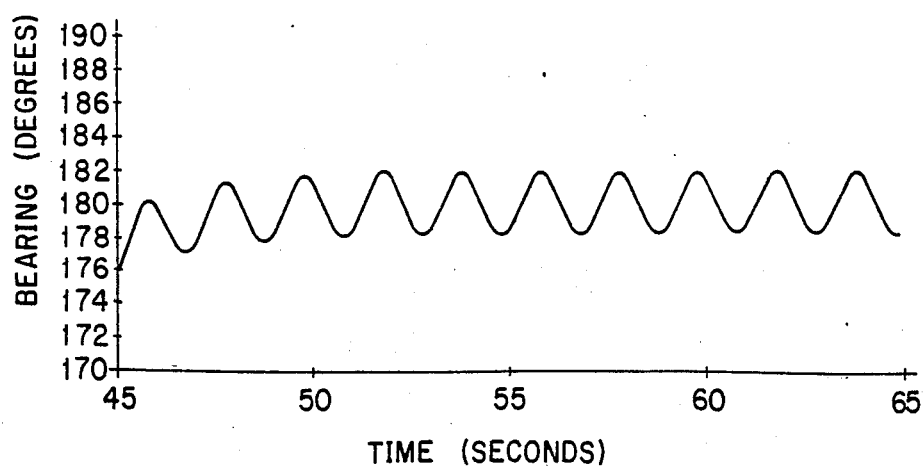
FIG. 5 is a graph showing a more detailed portion of the simulation of the FIG. 4 in the presence of ripple caused by rotor modulation.

In simulating the implementation of FIG. 3, appropriate digital representations of a VOR variable and reference signal were generated and portions of the output displayed in the graphs of FIGS. 4 and 5. In the graph of FIG. 4, the output bearing with respect to time is shown during a time period from 20 to 50 seconds with an initial bearing angle of 75°. Initially, the VOR signal was simulated with no interference and subsequently rotor modulation was added at 25 seconds and a step in bearing to 180° was made at 35 seconds. As can be seen in FIG. 4, the time delay for the circuit to reach 67% of its final value after a step change in input bearing was about 3 seconds. Also, as more particularly shown in FIG. 5 (expanded scale of FIG. 4 waveform) it can be seen that there was a 4% peak to peak ripple when the rotor modulation is present. Both the 4% peak to peak ripple and response time are acceptable in providing digital bearing indications with present low cost microprocessor control. In operation, the time constant for the bearing output (step change in bearing) may be varied by changing the bandwidth of the low-pass filter 26 following the arc tangent function performed at 24. The exact formulation will necessarily be dependent upon the anticipated effects of rotor modulation and the requirement for specific time constants for bearing output response.

As can be seen from the above description, the present invention provides an improved technique for enabling the implementation of a phase measurement technique, and more particularly, to providing an improved signal output representing bearing information in a digital VOR processing system. The system includes a digital phase locked loop coupled to derive sine and cosine values for providing equal amplitude in-phase and quadrature phase components which track the reference signal. Variations in amplitude and frequency of the reference signal therefore do not affect the amplitude or 90° phase relationship between the in-phase and quadrature phase components, thereby allowing accurate multiplications with the bearing signal to obtain accurate sine and cosine bearing information. By use of this implementation, reduced capacity microprocessors can be employed to produce the phase difference measurements necessary to reflect the bearing measurement made in the specific example of the aircraft navigation system described above. The system may be implemented with conventional digital circuits and used to modify digital systems currently employed to produce such bearing information. All of these are advantages that are unrecognized and not suggested by the prior art.

Although the invention has been described with specific reference to certain forms of implementations of the digital circuits, it is apparent that other structures could be used to accomplish the stated functions. Likewise, the signal used to obtain the sine and cosine values could be the 30 Hz variable signal rather than the 30 Hz reference. Naturally, the 30 Hz reference is normally subject to less interference than the 30 Hz variable signal and will allow a more accurate generation of the in-phase and quadrature phase signals. Nevertheless, other implementations capable of providing the in-phase and quadrature phase signals by use of the described modified digital phase locked loop would be acceptable in implementing any such phase difference measurement technique.

Obviously, many other modifications and variations of the present invention are possible in light of the above teachings. It is therefore to be understood that within the scope of the appended claims, the invention may be practiced otherwise than as specifically described.

```
      REAL*4   BRGSTP,BRGTMP,BRGINC
      REAL*4   DELTA,AM,FM,OMEGA,BRG,FM90,FMDLY
      REAL*8   AMFM,AMFM90
      REAL*8   V,V1,W,WS1,WS2,W1,WS11,WS12
      REAL*8   ASUM
      REAL*4   START,FREQ,BRG1,BRG2
      REAL     LPOUT,RFOV,RFOR1,JUNK
      INTEGER  INIT
      REAL     KLP
      INTEGER*4 VCO
      INTEGER*4 COSOUT,SINOUT
      INTEGER*4 IFM,II
      INTEGER*2 FMPTRO,FMPTR,SAMCT,TEND,PRTCT,INUM,IDECI

PARAMETER (IRANGE = 16384)

DATA     CNST/.56047644E-5/     # LOWPASS FILTER AFTER MULTIPLIES
      DATA     C1/-1.99566/           # 2 POLE CH
      DATA     C2/0.99569146/         # SAMPLE RATE = 281.53
      DATA     B1/2./                 # CUTOFF = .3 HZ   3DB RIPPLE
      DATA     B2/1./                 # STOP BAND = 30HZ -30 DB

DATA     CNSTA/0.33088129/      # INITIAL SAMPLE RATE REDUCER
      DATA     CA1/-1.51577473/       # BUTTERWORTH /4 REDUCER
      DATA     CA2/.702727627/        # 2 POLES 100 HZ CUTOFF
      DATA     BA1/2.0/               # 3 DB RIPPLE,140 HZ CUTOFF HIGH
      DATA     BA2/1.0/               # 30 DB STOP BAND

INUM  = 32
      TEND  = 32
      DELTA = .000888
      BRG   = 0.
```

```
    START = 20.
    FREQ = 30.
    BRGINC = 30
    KLP = .549864
    KLP = KLP *.000888 *4.

#   KLP = TAU(.549864 RADIANS) * .000888(TIME) *4(DECIMATION)
#   BRG FILTER

WHILE(BRG < BRGSTP )

(
            BRG1 = 0
            ASUM = 0.
            TIM = 0

IDECI = 0
    OMEGA = 2 * 3.14159 * FREQ
    II = 0
    BRG = BRG + BRGINC
    BRGTMP = BRG / 360. * 2. * 3.14159
    PRTCT = 0
    SAMCT = 0
    FMLDY = 0

WHILE (SAMCT < TEND)

(
            II = II + 1
            IDECI = IDECI + 1
            BRG2 = BRG1
            TIM = II * DELTA

AM = SIN(TIM * OMEGA)
            FM = SIN((TIM * OMEGA) + BRGTMP)

WA = CNSTA * AM - CA1 * WSA1 - CA2 * WSA2
            AM = WA + BA1 * WSA1 + BA2 * WSA2
            WSA2 = WSA1
            WSA1 = WA

WB = CNSTA * FM - CA1 * WSB1 - CA2 * WSB2
            FM = WB + BA1 * WSB1 + BA2 * WSB2
            WSB2 = WSB1
            WSB1 = WB

IF(IMOD(IDECI,4) == 0)           # DECIMATE BY 4

(
                    IFM = FMDLY * IRANGE
                    FMDLY = FM
                    CALL PLL(IFM,SINOUT,COSOUT,VCO,RFOV
                    ,RFOR1,LPOUT,INIT)

FM90 = FLOAT(SINOUT) / 32768.
                    FM0 = FLOAT(COSOUT) / 32768.

AMFM = AM * FM0
                    AMFM90 = AM * FM90

V = AMFM
                    V1 = AMFM90
```

```
W = CNST * V - C1 * WS1 - C2 * WS2
V = W + B1 * WS1 + B2 * WS2
WS2 = WS1
WS1 = W

W1 = CNST * V1 - C1 * WS11 - C2 * WS12
V1 = W1 + B1 * WS11 + B2 * WS12
WS12 = WS11
WS11 = W1

AMFM = W
AMFM90 = W1

BRG1 = ATAN2(AMFM90,AMFM)/2./3.14159*360.
IF ( AMFM90 < 0 ) BRG1 = 180 + BRG1
IF ( AMFM90 >= 0 ) BRG1 = BRG1 + 180
BRG1 = BRG2 + ((BRG1 - BRG2) * KLP)

IF(TIM >= START)
    (
    PRTCT = PRTCT + 1
    IF(PRTCT >= INUM)
        (
        PRTCT = 0
        SAMCT = SAMCT + 1
        ASUM = ASUM + BRG1
        )
    )
)
START = 15.
BRG1 = ASUM / FLOAT(TEND)
)
STOP
END

SUBROUTINE PLL(INPUT,SINOUT,COSOUT,VCO,RFOV,RFOR1,LPOUT,INIT)

#     PROGRAM TO LOCK TO 30 HZ FM SIGNAL AND GIVE TO SINE
#     AND COSINE SIGNAL BACK

#   VARIABLES WHICH MAY BE CONTROLLED ARE THE LOOP FILTER
#   COEFFICIENTS AFAC,LOOP GAIN AND ANOTHER LP FILTER

#     LOOKUP TABLE 128 WORDS

INTEGER*4 INPUT,VCO
      INTEGER INIT,INDEX
      INTEGER*4 PHSDET,COSOUT,SINOUT
      INTEGER*4 SINTAB(256),COSTAB(256)
      REAL RFOV,RFOR1,LPOUT,AFAC,KIN,GAIN
      REAL RDET,DT,RVCO,DDT,LPOUT1

PARAMETER (GAIN=.08614)
      PARAMETER (AFAC=1.2942)

#     KIN = 37.699324 * SAMPLE FREQ
```

```
    PARAMETER (KIN = .133908)
    IF (INIT == 0)

(
            INIT = 1
            DO IIII = 1,128

(
                    SINTAB(IIII)=SIN(FLOAT(IIII)/128.*2.*3.14159)*32768.
                    COSTAB(IIII)=COS(FLOAT(IIII)/128.*2.*3.14159)*32768.
                    )

)

DT = .000888
    DDT = DT * 4.

IF (INPUT .GT. 32767)
            INPUT = 32767
    ELSE IF(INPUT .LT. -32768)
            INPUT = -32768

PHASE DETECTOR

PHSDET = INPUT * SINOUT / 256

LOOP FILTER

RDET = FLOAT(PHSDET) * GAIN
    RFOV=RFOV+((1+(AFAC*DDT/2))*RDET)+(((AFAC*DDT/2)-1)*RFOR1)
    RFOR1 = RDET
    LPOUT1 = LPOUT1 + KIN * ( RFOV - LPOUT1 )
    LPOUT = LPOUT + KIN * ( LPOUT1 - LPOUT )

VCO

VCO = VCO + ( 1746 * 4 ) + IFIX( LPOUT / 256. )
    VCO = MOD(VCO,65536)

SINE / COSINE LOOKUP TABLE

RVCO = FLOAT(VCO) / 65536. * 2. * 3.14159
    INDEX = IFIX(FLOAT(VCO) / 512.) + 1
    SINOUT = SINTAB(INDEX)
    COSOUT = COSTAB(INDEX)
    RETURN
    END
```

What is claimed is:

1. A phase difference measurement system comprising:

means for receiving a first signal;

means for receiving a second signal having phase angles different from said first signal;

means for providing equal amplitude in-phase and quadrature phase components of one of said first and second signals independent of any amplitude or frequency variations of said one signal and comprising a phase locked loop including:

a multiplier having first and second inputs and an output, said first input being coupled to receive said one signal, means for amplifying the output of said multiplier to provide an amplified output, means for filtering said amplified output to provide a filtered output, a voltage controlled oscillator coupled to receive said filtered output and provide a variable signal in response thereto, and means responsive to said variable signal for producing said in-phase and quadrature phase components of said one signal, said quadrature phase component being coupled to the second input of said multiplier for multiplication with said one signal at asid first input to complete said phase locked loop;

means for multiplying the other of said first and second signals by said in-phase and quadrature phase components to produce sine and cosine outputs of said other signal; and means for providing an output of the inverse tangent of the quantity defined by the division of the sine output by the cosine output to produce a representation of the phase difference between said first and second signal.

* * * * *